(12) United States Patent
Chen et al.

(10) Patent No.: US 11,094,744 B2
(45) Date of Patent: Aug. 17, 2021

(54) INTERCONNECT LANDING METHOD FOR RRAM TECHNOLOGY

(71) Applicant: Taiwan Semiconductor Manufacturing Co., Ltd., Hsin-Chu (TW)

(72) Inventors: Hsia-Wei Chen, Taipei (TW); Chih-Yang Chang, Yuanlin Township (TW); Chin-Chieh Yang, New Taipei (TW); Jen-Sheng Yang, Keelung (TW); Kuo-Chi Tu, Hsin-Chu (TW); Wen-Ting Chu, Kaohsiung (TW); Yu-Wen Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/695,537

(22) Filed: Nov. 26, 2019

(65) Prior Publication Data

US 2020/0098828 A1    Mar. 26, 2020

Related U.S. Application Data

(60) Continuation of application No. 16/578,356, filed on Sep. 22, 2019, which is a division of application No.
(Continued)

(51) Int. Cl.
*H01L 27/105* (2006.01)
*H01L 23/522* (2006.01)
(Continued)

(52) U.S. Cl.
CPC ........ *H01L 27/2463* (2013.01); *H01L 23/528* (2013.01); *H01L 23/5226* (2013.01);
(Continued)

(58) Field of Classification Search
CPC .............. H01L 45/146; H01L 45/1617; H01L 45/1233; H01L 45/1608; H01L 45/16;
(Continued)

(56) References Cited

U.S. PATENT DOCUMENTS 4,336,320 A     6/1982  Cummings et al.
9,741,765 B1 *  8/2017  Narayanan ............ H01L 45/085
(Continued)

FOREIGN PATENT DOCUMENTS

JP    WO2009022373 A1    11/2010
KR       20150077330 A     7/2015

OTHER PUBLICATIONS

Non-Final Office Action dated Dec. 4, 2017 for U.S. Appl. No. 15/442,174.
(Continued)

*Primary Examiner* — Galina G Yushina
(74) *Attorney, Agent, or Firm* — Eschweiler & Potashnik, LLC

(57) ABSTRACT

The present disclosure, in some embodiments, relates to a method of forming an integrated chip. The method may be performed by forming a memory device over a substrate and forming an inter-level dielectric (ILD) layer over the memory device. The ILD layer is selectively etched to define a first cavity that exposes a top of the memory device and to define a second cavity that is laterally separated from the first cavity by the ILD layer. The second cavity is defined by a smooth sidewall of the ILD layer that extends between upper and lower surfaces of the ILD layer. A conductive material is formed within the first cavity and the second cavity.

20 Claims, 13 Drawing Sheets

Related U.S. Application Data

16/108,594, filed on Aug. 22, 2018, now Pat. No. 10,566,387, which is a division of application No. 15/442,174, filed on Feb. 24, 2017, now Pat. No. 10,163,981.

(60) Provisional application No. 62/328,215, filed on Apr. 27, 2016.

(51) Int. Cl.
  *H01L 23/528* (2006.01)
  *H01L 27/24* (2006.01)
  *H01L 45/00* (2006.01)
  *H01L 27/102* (2006.01)

(52) U.S. Cl.
  CPC ...... *H01L 27/1025* (2013.01); *H01L 27/1052* (2013.01); *H01L 27/2436* (2013.01); *H01L 45/1233* (2013.01); *H01L 45/146* (2013.01); *H01L 45/1608* (2013.01); *H01L 45/1675* (2013.01)

(58) Field of Classification Search
  CPC ... H01L 23/5226; H01L 23/528; H01L 24/43; H01L 27/2463; H01L 27/1052; H01L 27/1025; H01L 27/2436
  See application file for complete search history.

(56) References Cited

U.S. PATENT DOCUMENTS

| | | |
|---|---|---|
| 2012/0074507 A1 | 3/2012 | Jo et al. |
| 2012/0241710 A1 | 9/2012 | Liu et al. |
| 2012/0268981 A1 | 10/2012 | Hanzawa et al. |
| 2012/0314468 A1 | 12/2012 | Siau et al. |
| 2013/0064001 A1 | 3/2013 | Terai |
| 2013/0277635 A1 | 10/2013 | Hanzawa et al. |
| 2013/0320289 A1 | 12/2013 | Chen et al. |
| 2014/0063913 A1* | 3/2014 | Kawashima ....... G11C 13/0069 365/148 |
| 2014/0203236 A1* | 7/2014 | Chen ..................... H01L 45/16 257/4 |
| 2015/0090949 A1* | 4/2015 | Chang ................. H01L 45/1683 257/4 |
| 2015/0187418 A1 | 7/2015 | Tsai et al. |
| 2017/0092693 A1 | 3/2017 | Tan et al. |

OTHER PUBLICATIONS

Final Office Action dated Apr. 23, 2018 for U.S. Appl. No. 15/442,174.
Notice of Allowance dated Jul. 27, 2018 for U.S. Appl. No. 15/442,174.
Non-Final Office Action dated Jul. 12, 2019 for U.S. Appl. No. 16/108,594.
Notice of Allowance dated Nov. 4, 2019 for U.S. Appl. No. 16/108,594.

* cited by examiner

INTERCONNECT LANDING METHOD FOR RRAM TECHNOLOGY

REFERENCE TO RELATED APPLICATIONS

This Application is a Continuation of U.S. application Ser. No. 16/578,356, filed on Sep. 22, 2019, which is a Divisional of U.S. application Ser. No. 16/108,594, filed on Aug. 22, 2018, which is a Divisional of U.S. application Ser. No. 15/442,174, filed on Feb. 24, 2017 (now U.S. Pat. No. 10,163,981, issued on Dec. 25, 2018), which claims the benefit of U.S. Provisional Application No. 62/328,215, filed on Apr. 27, 2016. The contents of the above-referenced Patent Applications are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for a next generation non-volatile memory technology. RRAM has a simple structure, consumes a small cell area, has a low switching voltage and fast switching times, and is compatible with CMOS fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
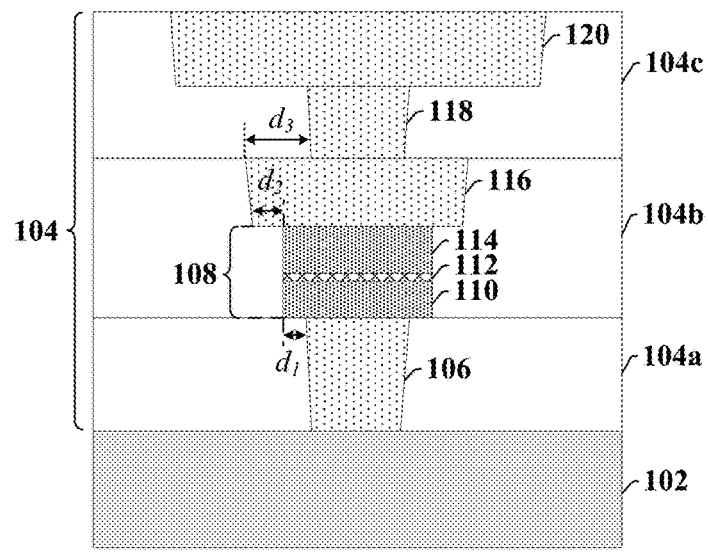
FIG. 1 illustrates a cross-sectional view of some embodiments of an integrated chip (IC) comprising a resistive random access memory (RRAM) device having an upper electrode contacting an overlying interconnect wire.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices generally comprise a layer of high-k dielectric material arranged between upper and lower conductive electrodes disposed within a back-end-of-the-line (BEOL) metallization stack. RRAM devices are configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. An RRAM device having a first (e.g., high) resistive state corresponds to a first data value (e.g., a logical '0') and an RRAM device having a second (e.g., low) resistive state corresponds to a second data value (e.g., a logical '1').

Typically, an RRAM device has an upper electrode that contacts an overlying interconnect via (which is set back from outermost sidewalls of the upper electrode). However, as the feature sizes of technology nodes are reduced through scaling upper electrodes of RRAM devices become smaller. As the size of the upper electrodes becomes smaller, the process window of an RRAM device becomes smaller and it becomes more difficult to accurately land an interconnect via onto the upper electrode. For example, as the size of the upper electrode decreases, the size of overlay and critical dimension (CD) tolerances becomes larger, as a percentage, compared to a size of the upper electrode. Errors in landing an interconnect via onto an upper electrode can result in a poor electrical connection between the upper electrode and the interconnect via. The poor electrical connection can lead to high resistance connections and even device failure.

The present disclosure relates to an integrated circuit having an interconnect wire contacting an upper electrode of an RRAM (resistive random access memory) device, and a method of formation. In some embodiments, the integrated chip comprises an RRAM device arranged over a substrate. The RRAM device has a dielectric layer arranged between a lower electrode and an upper electrode. An interconnect wire contacts the upper electrode. An interconnect via is arranged onto the interconnect wire and is set back from one or more outermost sidewalls of the interconnect wire. The interconnect wire has a relatively large size that provides for a good electrical connection between the interconnect wire and the upper electrode, thereby increasing a process window of the RRAM device.

FIG. 1 illustrates a cross-sectional view of some embodiments of an integrated chip 100 comprising a resistive random access memory (RRAM) device having an upper electrode contacting an overlying interconnect wire.

The integrated chip 100 comprises an RRAM device 108 disposed within a dielectric structure 104 overlying a substrate 102. The dielectric structure 104 comprises a plurality of stacked inter-level dielectric (ILD) layers 104a-104c surrounding a plurality of interconnect layers. The RRAM device 108 comprises a lower electrode 110, a dielectric data storage layer 112 arranged over the lower electrode 110, and an upper electrode 114 arranged over the dielectric data storage layer 112. The lower electrode 110 comprises a conductive material, the dielectric data storage layer 112 comprises a dielectric material having a variable resistance, and the upper electrode 114 comprises a conductive material.

The RRAM device 108 is arranged over a lower interconnect structure 106 arranged within the dielectric structure 104. The RRAM device 108 has sidewalls that are laterally offset from sidewalls of the lower interconnect structure 106. In some embodiments, the RRAM device 108 may extend past sidewalls of the lower interconnect structure 106 by a first distance $d_1$ (e.g., when the lower interconnect structure is an interconnect via). In other embodiments (not shown), the RRAM device 108 may be set back from sidewalls of the lower interconnect structure 106 (e.g., when the lower interconnect structure is an interconnect wire).

An upper interconnect wire 116 is arranged over the RRAM device 108. The upper interconnect wire 116 laterally extends past opposing sidewalls of the RRAM device 108 by a second distance $d_2$. In some embodiments, the upper interconnect wire 116 directly contacts the upper electrode 114 of the RRAM device 108. It will be appreciated that as described herein, the upper interconnect wire 116 may comprise one or more liner layers (not shown) arranged along a lower surface and/or sidewalls of the upper interconnect wire 116. For example, the one or more liner layers may comprise a diffusion barrier layer configured to prevent diffusion of metal ions into the surrounding dielectric structure 104.

The upper interconnect wire 116 and the RRAM device 108 may be arranged within a same ILD layer (e.g., between vertically adjacent etch stop layers). For example, in some embodiments, the upper interconnect wire 116 and the RRAM device 108 may be arranged within a second ILD layer 104b disposed over a first ILD layer 104a surrounding the lower interconnect structure 106. In other embodiments, the lower interconnect structure 106 may be surrounded by a same ILD layer as the RRAM device 108 and the upper interconnect wire 116.

An interconnect via 118 is arranged onto the upper interconnect wire 116 (so that the RRAM device 108 is separated from the interconnect via 118 by the upper interconnect wire 116). The interconnect via 118 is set back from one or more sidewalls of the upper interconnect wire 116 by a third distance $d_3$. An additional interconnect wire 120 may be arranged over the interconnect via 118. In some embodiments, the interconnect via 118 and the additional interconnect wire 120 are arranged within a same ILD layer. For example, the interconnect via 118 and the additional interconnect wire 120 may be arranged within a third ILD layer 104c arranged over the second ILD layer 104b.

Because the upper interconnect wire 116 extends past opposing sidewalls of the RRAM device 108, it improves a process window of the RRAM device 108 and provides for a good electrical connection between the upper electrode 114 and the upper interconnect wire 116. The good electrical connection makes the RRAM device 108 less susceptible to processing errors (e.g., overlay errors, critical dimension (CD) errors, etc.).

Figure 2:
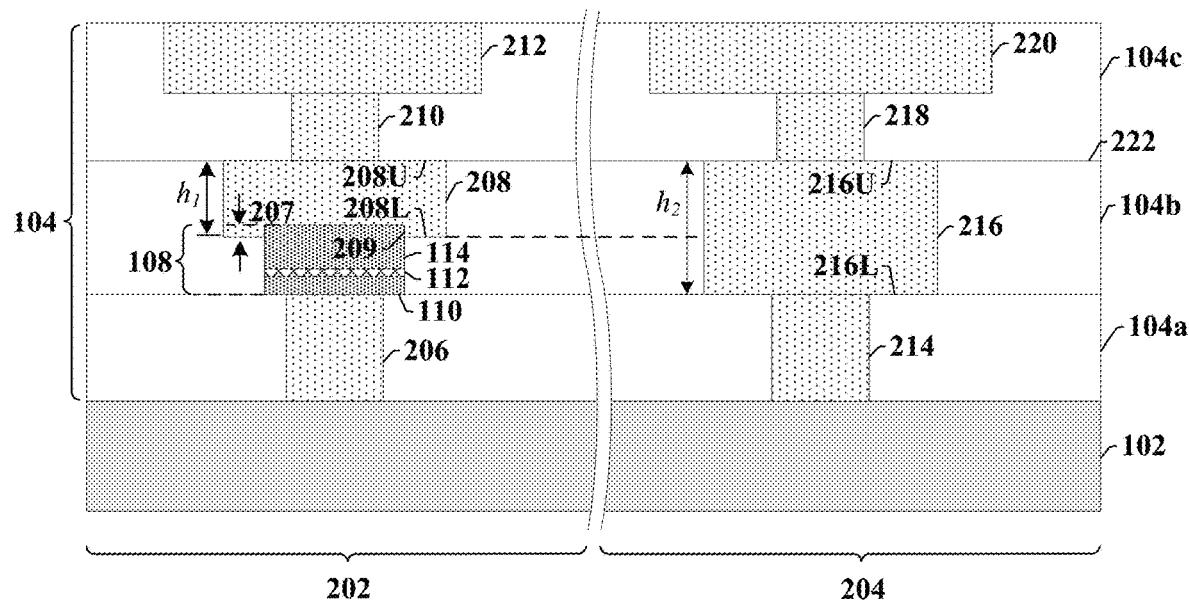
FIG. 2 illustrates a cross-sectional view of some additional embodiments of an IC having an RRAM device with an upper electrode contacting an overlying interconnect wire.

FIG. 2 illustrates a cross-sectional view of some additional embodiments of an integrated chip 200 having an RRAM device with an upper electrode contacting an overlying interconnect wire.

The integrated chip 200 comprises a memory region 202 and a logic region 204. The memory region 202 comprises a first lower interconnect structure 206 arranged within a first ILD layer 104a disposed over a substrate 102. In various embodiments, the substrate 102 may comprise any type of semiconductor body as well as any other type of interconnect layer and/or device associated therewith. In some embodiments, the first lower interconnect structure 206 may comprise a conductive contact arranged between a first interconnect wire and the substrate 102. In other embodiments (not shown), the first lower interconnect structure 206 may comprise an interconnect via separated from the substrate 102 by one or more interconnect wires. In yet embodiments (not shown), the first lower interconnect structure 206 may comprise an interconnect wire.

An RRAM device 108 is arranged over the first lower interconnect structure 206 and an upper interconnect wire 208 is arranged over the RRAM device 108. The RRAM device 108 and the upper interconnect wire 208 are arranged within a second ILD layer 104b disposed over the first ILD layer 104a. The upper interconnect wire 208 has a lower surface 208L contacting the RRAM device 108 and an upper surface 208U contacting a first interconnect via 210. An additional interconnect wire 212 is arranged over the first interconnect via 210. The first interconnect via 210 and the additional interconnect wire 212 are arranged within a third ILD layer 104c disposed over the second ILD layer 104b.

In some embodiments, the upper interconnect wire 208 extends below an upper surface of the RRAM device 108 by a distance 207. In such embodiments, the upper interconnect wire 208 has interior sidewalls 209 defining a recess within the lower surface 208L of the upper interconnect wire 208. The RRAM device 108 partially extends to within the recess so that the upper interconnect wire 208 laterally surrounds outermost sidewalls of the RRAM device 108.

The logic region 204 comprises a second lower interconnect structure 214 arranged within the first ILD layer 104a. In various embodiments, the second lower interconnect structure 214 may comprise a conductive contact, an interconnect via, or an interconnect wire. A first interconnect wire 216 is arranged within the second ILD layer 104b over the second lower interconnect structure 214. A second interconnect via 218 is arranged over the first interconnect wire 216 and a second interconnect wire 220 is arranged over the second interconnect via 218. In some embodiments, the second interconnect via 218 and the second interconnect wire 220 are arranged within the third ILD layer 104c.

The upper interconnect wire 208 and the first interconnect wire 216 extend to an upper surface 222 of the second ILD layer 104b. The upper interconnect wire 208 has a first height $h_1$ that is less than a second height $h_2$ of the first interconnect wire 216. In some embodiments, the lower surface 208L of the upper interconnect wire 208 is arranged at a position that is above a lower surface 216L of the first interconnect wire 216. In some embodiments, the upper interconnect wire 208 and the first interconnect wire 216 have upper surfaces, 208U and 216U, which are substantially co-planar (e.g., planar within tolerances of a chemical mechanical planarization process).

Figure 3:
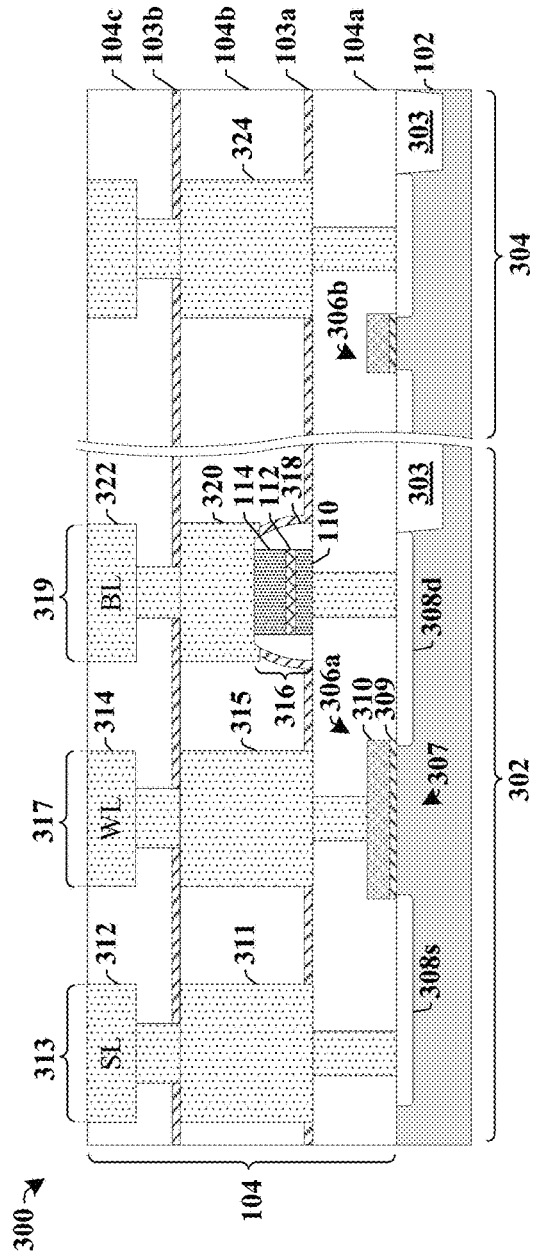
FIG. 3 illustrates a cross-sectional view of some additional embodiments of an IC having an RRAM cell comprising an RRAM device with an upper electrode contacting an overlying interconnect wire.

FIG. 3 illustrates a cross-sectional view of some additional embodiments of an integrated chip 300 having an RRAM cell comprising an RRAM device with an upper electrode contacting an overlying interconnect wire. Although the integrated chip 300 is illustrated as having a 1T1R (one transistor, one resistor) RRAM device structure, it will be appreciated that in other embodiments the disclosed RRAM device can be applied with other RRAM device structures (e.g., a 2T2R).

The integrated chip 300 comprises a memory region 302 having an RRAM device 316 arranged within a dielectric structure 104 comprising a plurality of ILD layers 104a-104c separated by etch stop layers (ESLs) 103a-103b. The memory region 302 comprises a first transistor device 306a arranged within a substrate 102. The first transistor device 306a includes a source region 308s and a drain region 308d separated by a channel region 307. The first transistor device 306a also comprises a gate electrode 310 separated from the channel region 307 by a gate dielectric 309. Isolation structures 303 (e.g., shallow trench isolation structures) may be arranged on one or more sides of the first transistor device 306a to provide isolation between the first transistor device 306a and adjacent transistor devices.

The source region 308s is coupled to a select-line 312 by way of a first stack of interconnect layers 313 comprising one or more conductive contacts, interconnect wires, and/or interconnect vias. The gate electrode 310 is coupled to a word-line 314 by way of a second stack of interconnect layers 317 comprising one or more conductive contacts, interconnect wires, and/or interconnect vias. The drain region 308d is coupled to a lower electrode 110 of the RRAM device 316 by way a third stack of interconnect layers 319 comprising one or more conductive contacts, interconnect wires, and/or interconnect vias. The lower electrode 110 of the RRAM device 316 is separated from an upper electrode 114 by way of a dielectric data storage layer 112. An upper interconnect wire 320 further couples the upper electrode 114 of the RRAM device 316 to a bit-line 322 overlying the RRAM device 316.

During operation of the RRAM device 316, the select-line 312, the word-line 314, and the bit-line 322 are configured to apply voltages to the RRAM device 316. A voltage difference between the lower electrode 110 and the upper electrode 114 will generate an electric field that extends into the dielectric data storage layer 112. The electric field acts upon oxygen vacancies within the dielectric data storage layer 112, inducing conductive paths (e.g., comprising the oxygen vacancies) to form across the dielectric data storage layer 112. Depending on an applied voltage, the dielectric data storage layer 112 will undergo a reversible change between resistive states associated with first and second data states.

In some embodiments, sidewall spacers 318 may be arranged on opposing sides of the RRAM device 316. In various embodiments, the sidewall spacers 318 may comprise silicon nitride, silicon oxy-nitride, or silicon dioxide, for example. In some embodiments, the sidewall spacers 318 may laterally separate an interior sidewall of the upper interconnect wire 320 from a sidewall of the upper electrode 114 (since the sidewall spacers 318 more resistance to etching than the ILD layer 104b during fabrication of the integrated chip 300). In some embodiments, a first ESL 103a extending between a first ILD layer 104a and a second ILD layer 104b extends along opposing sides of the RRAM device 316 to a lower surface of the upper interconnect wire 320. The etch stop layer 103a may directly contact sidewalls of the sidewall spacers 318. Because the first ESL 103a extends along sidewalls of the RRAM device 316, the RRAM device 316 may not be separated from the first ILD layer 104a by an etch stop layer.

In some embodiments, the first stack of interconnect layers 313 and the second stack of interconnect layers 317 respectively comprise interconnect wires, 311 and 315, which are laterally separated from the RRAM device 316. The interconnect wires, 311 and 315, extend between a lower surface and an upper surface of the second ILD layer 104b. The upper interconnect wire 320 extends from the upper surface of the second ILD layer 104b to a position over the lower surface of the second ILD, so that the upper interconnect wire has a height that is smaller than a height of the interconnect wires, 311 and 315. In some embodiments, the upper interconnect wire 320 and the interconnect wires, 311 and 315, may have upper surfaces that are substantially co-planar (e.g., planar within tolerances of a CMP process).

In some embodiments, the integrated chip 300 may further comprise a logic region 304 having a second transistor device 306b arranged within the substrate 102. A first interconnect wire 324 is arranged within the second ILD layer 104b within the logic region 304. In some embodiments, the first interconnect wire 324 has a height that is substantially equal to the height of metal interconnect wires, 311 and 315, within the memory region 302.

Figure 4:
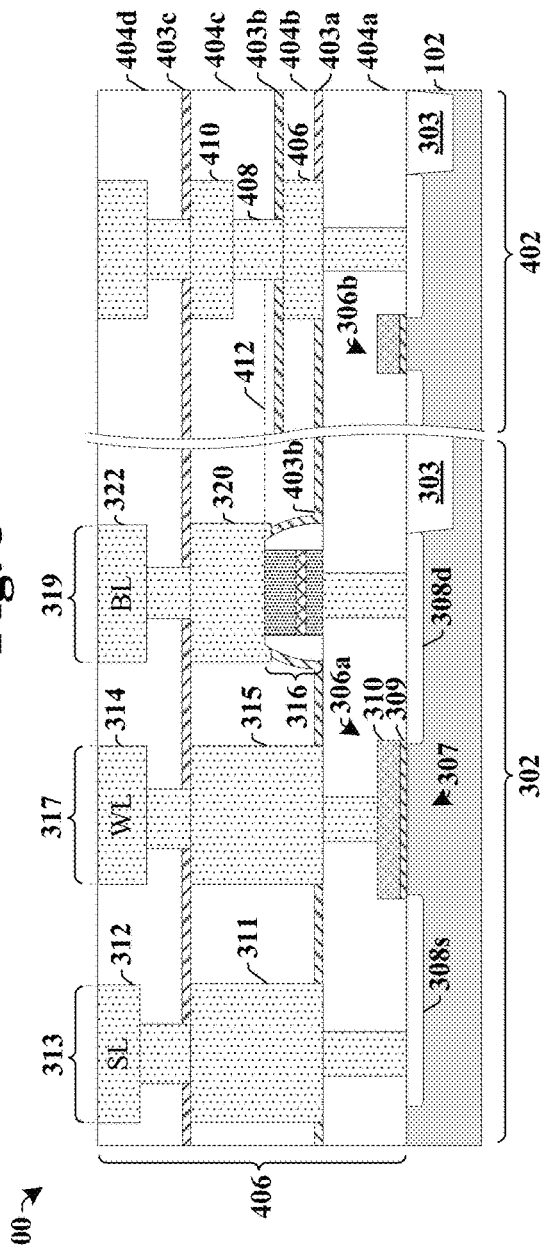
FIG. 4 illustrates a cross-sectional view of some alternative embodiments of an IC having an RRAM cell comprising an RRAM device with an upper electrode contacting an overlying interconnect wire.

FIG. 4 illustrates a cross-sectional view of some alternative embodiments of an integrated chip 400 having an RRAM cell comprising an RRAM device with an upper electrode contacting an overlying interconnect wire.

The integrated chip 400 comprises a memory region 302 and a logic region 402. The memory region comprises an RRAM device 316 arranged within a third ILD layer 404c over a substrate 102. The third ILD layer 404c is separated from a first ILD layer 404a by a second etch stop layer (ESL) 403b. In some embodiments, the third ILD layer 404c contacts an upper surface of the second ESL 403b while the first ILD layer 404b contacts a lower surface of the second ESL 403b. An upper interconnect wire 320 is arranged over RRAM device 316 within the third ILD layer 404c. The upper interconnect wire 320 extends past opposing sidewalls of the RRAM device 316.

The logic region 402 comprises a first interconnect wire 406 arranged within a second ILD layer 404b over the first ILD layer 404a. The second ILD layer 404b is separated from the first ILD layer 404a by a first ESL 403a. A first interconnect via 408 and a second interconnect wire 410 are arranged within the third ILD layer 404c, which is separated from the second ILD layer 404b by the second ESL 403b. In some embodiments, the first ESL 403a and the second ESL 403b may comprise a same material. In other embodiments, the first ESL 403a and the second ESL 403b may comprise different materials.

The first interconnect wire 406 has a first height that is less than a height of the RRAM device 316, and the second interconnect wire 410 has a second height that is less a height of the upper interconnect wire 320. This causes a top surface of the RRAM device 316 to be aligned with the first interconnect via 408, so that a line 412 extending along an upper surface of the RRAM device 316 intersects the first interconnect via 408.

Figure 5:
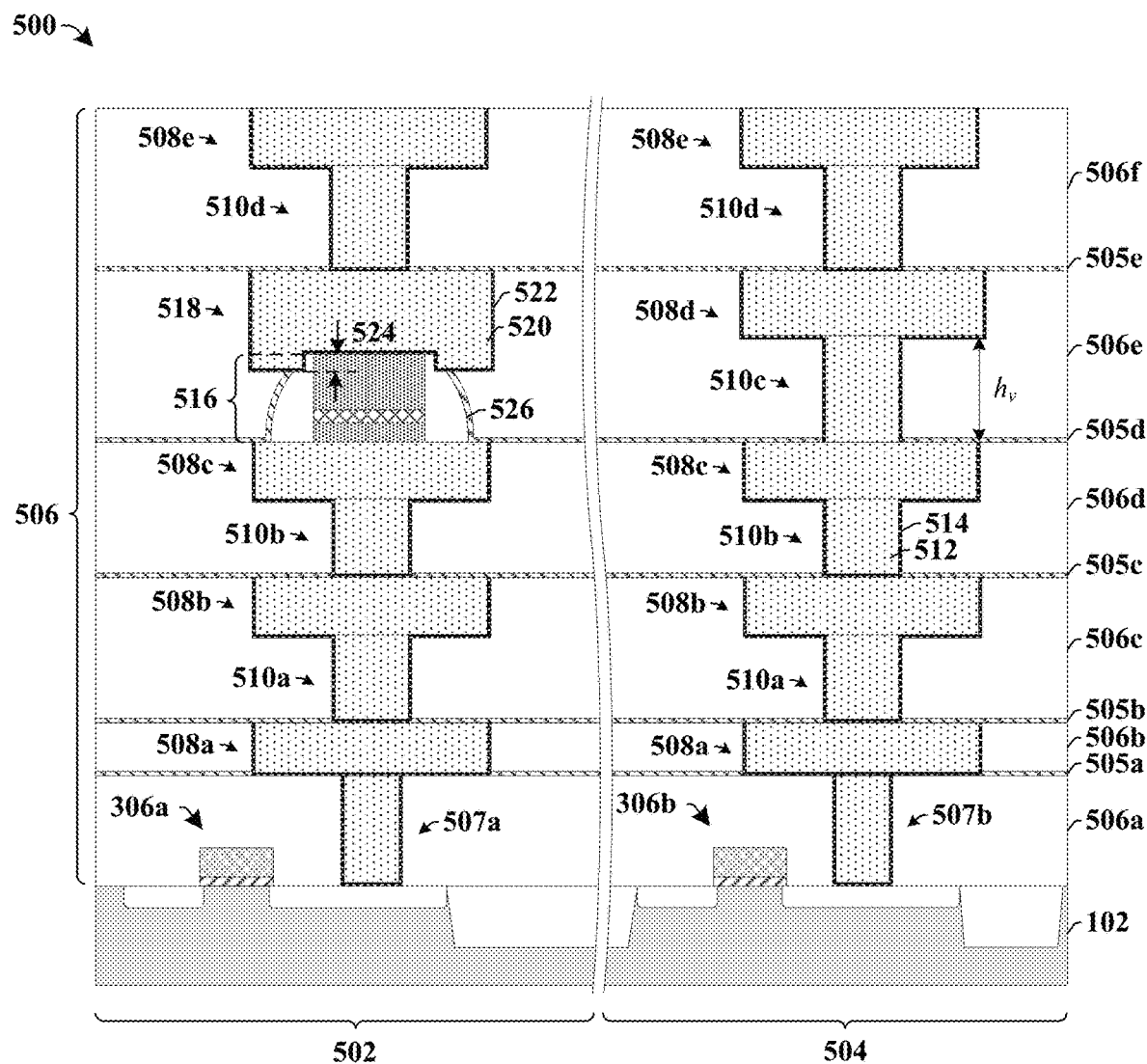
FIG. 5 illustrates a cross-sectional view of some additional embodiments of an IC having an RRAM device with an upper electrode contacting an overlying metal interconnect wire.

FIG. 5 illustrates a cross-sectional view of some additional embodiments of an integrated chip 500 having an RRAM device with an upper electrode contacting an overlying metal interconnect wire.

The integrated chip 500 comprises a memory region 502 and a logic region 504, respectively having a plurality of back-end-of-the-line (BEOL) metal interconnect layers disposed within a dielectric structure 506 over a substrate 102. In some embodiments, the dielectric structure 506 may comprise a plurality of stacked inter-level dielectric (ILD) layers 506a-506f. In various embodiments, the plurality of ILD layers 506a-506f may comprise one or more dielectric materials, such as a low-k dielectric material or an ultra-low-k (ULK) dielectric material, for example. In some embodiments, the one or more dielectric materials may comprise $SiO_2$, SiCO, a fluorosilicate glass, a phosphate glass (e.g., borophosphate silicate glass), etc. In some embodiments, etch stop layers (ESLs) 505a-505e may be disposed between adjacent ones of the ILD layers 506a-506f. For example, a first ESL 505a is disposed between a first ILD layer 506a and a second ILD layer 506b, a second ESL 505b is disposed between the second ILD layer 506b and a third ILD layer 506c, etc. In various embodiments, the ESLs 505a-505e may comprise a nitride, silicon carbide, carbon-doped oxide, or other similar materials.

A first conductive contact 507a and a second conductive contact 507b are arranged within the first ILD layer 506a. The first conductive contact 507a is electrically connected to a first transistor device 306a and the second conductive contact materials is electrically connected to a second transistor device 306b. In various embodiments, the first conductive contact 507a and the second conductive contact 507b may be connected to a source region, a drain region, or a gate electrode of the first transistor device 306a and the second transistor device 306b. In some embodiments, the first conductive contact 507a and the second conductive contact 507b may comprise tungsten, for example.

Alternating layers of metal interconnect wires 508a-508e and metal vias 510a-510d are disposed over the first conductive contact 507a and the second conductive contact 507b. The metal interconnect wires 508a-508e and metal vias 510a-510d comprise a conductive material. In some embodiments, the metal interconnect wires 508a-508e and metal vias 510a-510d comprise a conductive core 512 and a liner layer 514 that separates the conductive core from surrounding ILD layers. In some embodiments, the liner layer may comprise titanium (Ti), titanium nitride (TiN), tantalum (Ta), or tantalum nitride (TaN). In some embodiments, the conductive core may comprise copper and/or aluminum, and/or carbon nanotubes, for example.

In some embodiments, the metal interconnect wires 508a-508e and metal vias 510a-510d may have different minimum width (i.e., minimum dimension) values. For example, metal interconnect wires 508a may have a first minimum width value (e.g., less than or equal to approximately 30-40 nm), while interconnect wires 508b may have a second minimum width value that is greater than the first minimum width value (e.g., greater than or equal to approximately 40-50 nm). In some embodiments, the minimum width of metal interconnect wires 508a-508e and metal vias 510a-510d may increase as a distance from the substrate increases 102.

An RRAM device 516 is arranged between metal interconnect wire 508c and an upper metal interconnect wire 518. The RRAM device 516 is laterally separated from metal via 510c by ILD layer 506e. In some embodiments, the metal via 510c may have a height $h_v$ that is larger than a height of the RRAM device 516. In such embodiments, the upper metal interconnect wire 518 has a height that is larger than a height of metal interconnect wire 508d.

In some embodiments, the upper metal interconnect wire 518 extends below a top surface of the RRAM device 516 by a distance 524. In some embodiments, the distance 524 is larger than a thickness of the liner layer 522. In such embodiments, the liner layer 522 and the conductive core 520 have bottom surfaces arranged below the top surface of the RRAM device 516. In other embodiments (not shown), the distance 524 is smaller than a thickness of the liner layer 522. In such embodiments, the liner layer 522 has a bottom surface arranged below the top surface of the RRAM device 516, while the conductive core 520 has a bottom surface comprising a portion that is arranged below the top surface of the RRAM device 516. In some embodiments, wherein the RRAM device 516 comprises sidewall spacers 526 arranged along opposing sides of the RRAM device 516, the sidewall spacers 526 may be arranged laterally between the upper metal interconnect wire 518 and the RRAM device 516.

FIGS. 6-12 illustrate some embodiments of cross-sectional views 600-1200 showing a method of forming an IC comprising an RRAM device having an upper electrode contacting an interconnect wire. Although the cross-sectional-views shown in FIGS. 6-12 are described with reference to a method of forming an RRAM device having an upper electrode contacting an interconnect wire, it will be appreciated that the structures shown in the figures are not limited to the method of formation but rather may stand alone separate of the method.

Figure 6:
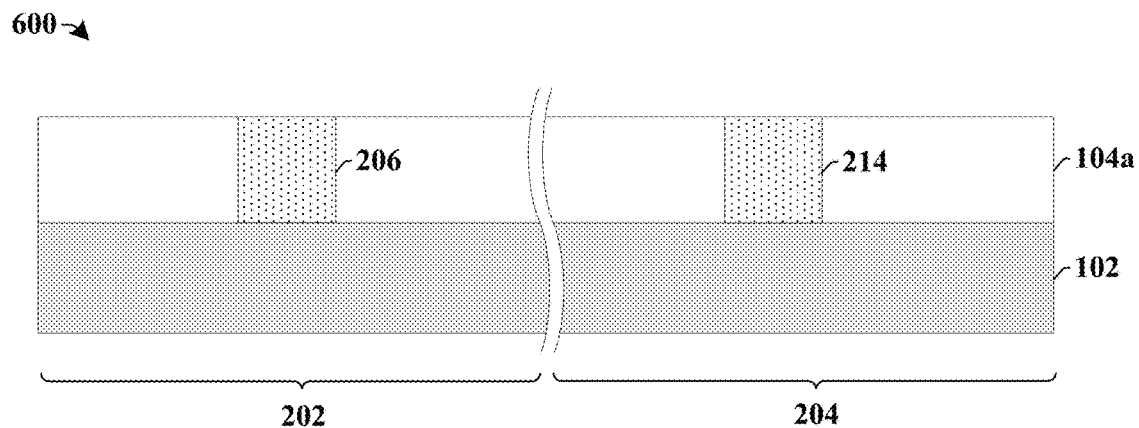
FIGS. 6-12 illustrate some embodiments of cross-sectional views showing a method of forming an IC comprising an RRAM device having an upper electrode contacting an overlying interconnect wire.

As illustrated in cross-sectional view 600 of FIG. 6, a lower interconnect layer is formed within a first ILD layer 104a over a substrate 102. The lower interconnect layer comprises a first lower interconnect structure 206 arranged over the substrate 102 within a memory region 202 and a second lower interconnect structure 214 arranged over the substrate 102 within a logic region 204. In various embodiments, the substrate 102 may comprise any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. In some embodiments, the lower interconnect layer may comprise conductive contacts arranged between a first interconnect wire layer and the substrate 102. In other embodiments (not shown), the lower interconnect layer may comprise interconnect vias separated from the substrate 102 by one or more metal interconnect wires. In yet other embodiments (not shown), the lower interconnect layer may comprise interconnect wires.

In some embodiments, the first lower interconnect structure 206 and the second lower interconnect structure 214 may be formed using a single damascene process. For example, the first lower interconnect structure 206 and the second lower interconnect structure 214 may be formed by forming the first ILD layer 104a over the substrate 102 using a vapor deposition process (e.g., atomic layer deposition, physical vapor deposition, chemical vapor deposition, etc.). The first ILD layer 104a is selectively etched to define a plurality of cavities within the first ILD layer 104a. The plurality of cavities are filled with a first conductive material. In various embodiments, the first conductive material may comprise copper, tungsten, aluminum, and/or carbon nanotubes, for example. In some embodiments, the first conductive material may be deposited by way of a plating process (e.g., an electro plating process, an electro-less plating process). In other embodiments, the first conductive material may be deposited using a vapor deposition technique (e.g., CVD, PVD, ALD, PE-ALD, etc.). In some embodiments, one or more liner layers (not shown) may be deposited within the plurality of cavities prior to filling the plurality of cavities with the first conductive material.

Figure 7:
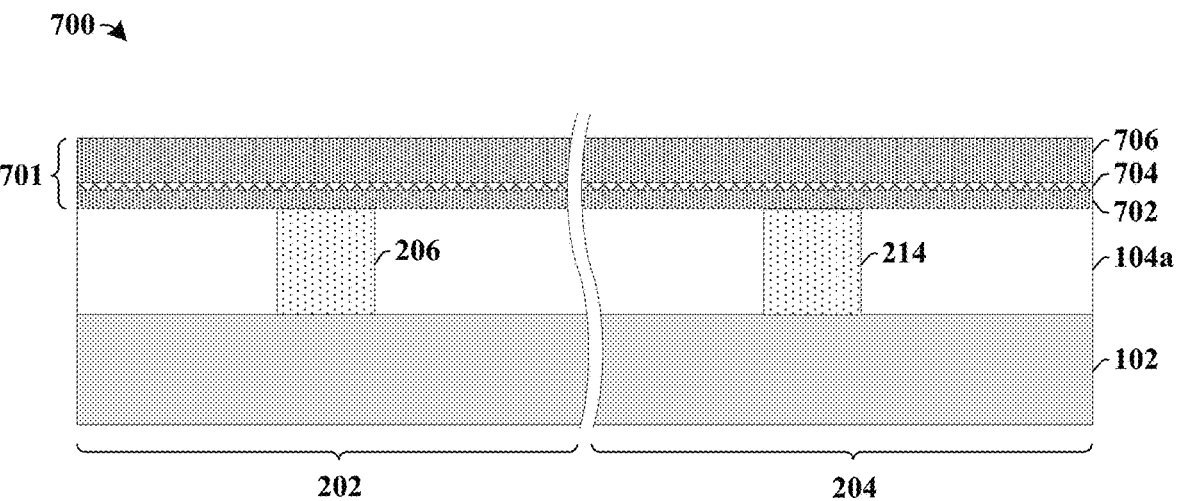

As illustrated in cross-sectional view 700 of FIG. 7, an RRAM stack 701 is formed over the first ILD layer 104a within the memory region 202 and within the logic region 204. In some embodiments, the RRAM stack 701 may be formed by forming a lower electrode layer 702 over the first ILD layer 104a, a dielectric data storage layer 704 over the lower electrode layer 702, and an upper electrode layer 706 over the dielectric data storage layer 704. In some embodiments, the lower electrode layer 702 may be formed onto a diffusion barrier layer (not shown) formed over the lower interconnect layer.

In various embodiments, the lower electrode layer 702, the dielectric data storage layer 704, and the upper electrode layer 706 may be deposited using vapor deposition techniques (e.g., CVD, PVD, ALD, PE-ALD, etc.). In various embodiments, the lower electrode layer 702 and the upper electrode layer 706 may comprise a metal nitride or a metal. For example, in some embodiments, the lower electrode layer 702 and/or the upper electrode layer 706 may comprise a conductive material such as platinum (Pt), aluminum-copper (AlCu), titanium nitride (TiN), gold (Au), titanium (Ti), tantalum (Ta), tantalum nitride (TaN), tungsten (W), tungsten nitride (WN), and/or copper (Cu), for example. In various embodiments, the dielectric data storage layer 704 may comprise nickel oxide (NiO), titanium oxide (TiO), hafnium oxide (HfO), zirconium oxide (ZrO), zinc oxide (ZnO), tungsten oxide ($WO_3$), aluminum oxide ($Al_2O_3$), tantalum oxide (TaO), molybdenum oxide (MoO), and/or copper oxide (CuO), for example As illustrated in cross-sectional view 800 of FIG. 8, the RRAM stack 701 (of FIG. 7) is patterned to define an RRAM device 108 within the memory region 202. The RRAM device 108 comprises a lower electrode 110, a dielectric data storage layer 112 arranged over the lower electrode 110, and an upper electrode 114 arranged over the dielectric data storage layer 112. In some embodiments, the RRAM device 108 may extend past sidewalls of the first lower interconnect structure 206 by a first distance $d_1$. In other embodiments (not shown), the RRAM device 108 may be set back from sidewalls of the first lower interconnect structure 206.

In some embodiments, the RRAM stack 701 (of FIG. 7) may be patterned by selectively exposing the RRAM stack to an etchant in areas not covered by a masking layer (e.g., a photoresist layer and/or a hardmask layer). In some embodiments, the etchant may comprise a dry etchant have an etching chemistry comprising a fluorine species (e.g., $CF_4$, $CHF_3$, $C_4F_8$, etc.). In other embodiments, the etchant may comprise a wet etchant comprising hydroflouric acid (HF). In some embodiments, patterning the RRAM stack may remove the RRAM stack from within the logic region 204.

In some embodiments, sidewall spacers 318 may be formed on opposing sides of the RRAM device 108. In such embodiments, the sidewall spacers 318 may be formed by depositing a spacer layer over the first ILD layer 104a. The spacer layer is subsequently etched to remove the spacer layer from horizontal surfaces, leaving the spacer layer along opposing sides of the RRAM device 108 as the sidewall spacers 318. In various embodiments, the spacer layer may comprise silicon nitride, a silicon dioxide ($SiO_2$), silicon oxy-nitride (e.g., SiON), or a similar material.

Figure 9:
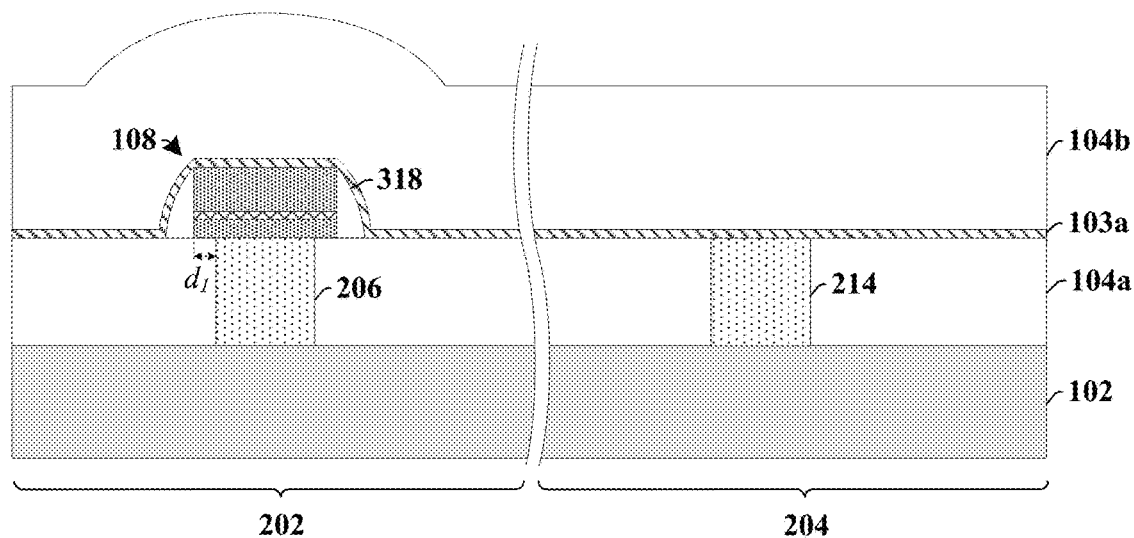

As illustrated in cross-sectional view 900 of FIG. 9, a second ILD layer 104b is formed over the RRAM device 108. The second ILD layer 104b may be formed by a vapor deposition technique (e.g., CVD, PVD, ALD, PE-ALD, etc.). In some embodiments, a first etch stop layer (ESL) 103a may be formed over the first ILD layer 104a prior to forming the second ILD layer 104b. The first ESL 103a extends along sidewalls and over an upper surface of the RRAM device 108. However, because the first ESL 103a is deposited after patterning the RRAM stack, the first ESL 103a does not extend below the RRAM device 108. Thus, the RRAM device 108 is not separated from the first ILD layer 104a by an etch stop layer.

Figure 10:
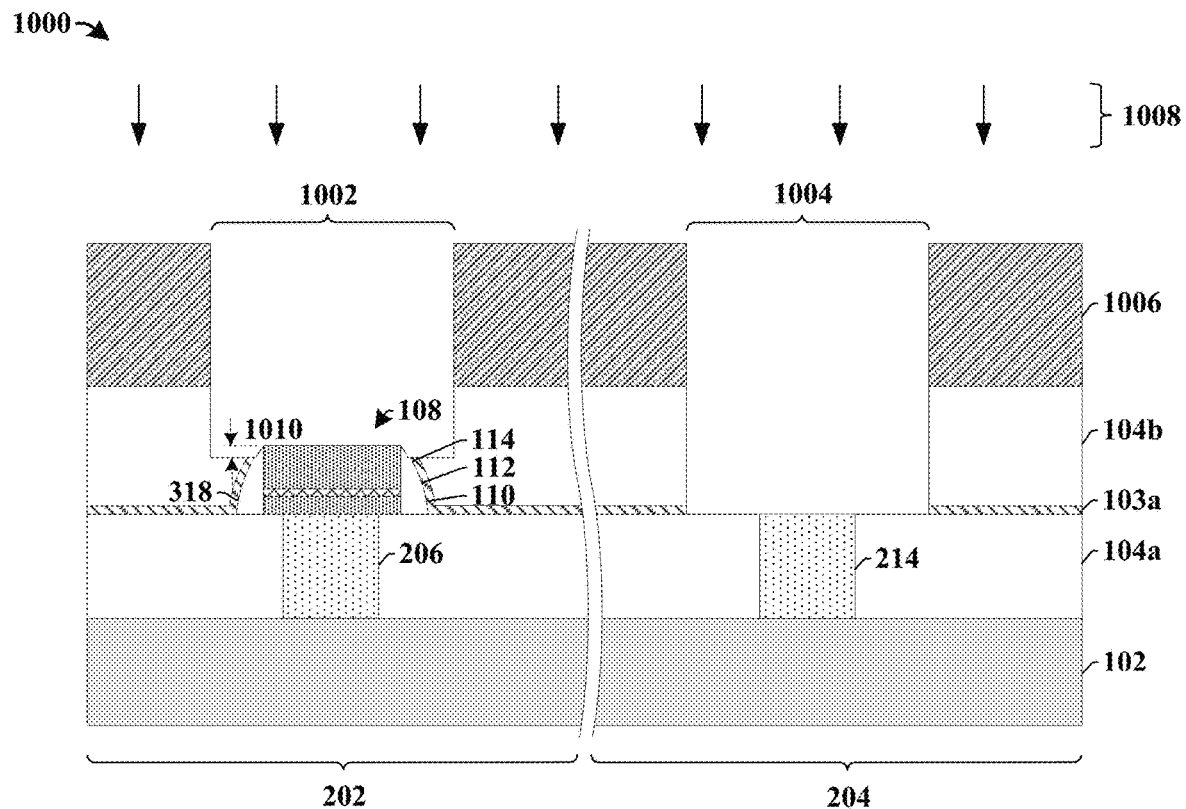

As illustrated in cross-sectional view 1000 of FIG. 10, the second ILD layer 104b is selectively etched to define a second plurality of cavities 1002-1004 within the second ILD layer 104b. In some embodiments, the second ILD layer 104b may be patterned by selectively exposing the second ILD layer 104b to an etchant 1008 in areas not covered by a masking layer 1006. In various embodiments, the etchant 1008 may comprise a dry etchant (e.g., $CF_4$, $CHF_3$, $C_4F_8$, etc.) or a wet etchant (hydroflouric acid). In some embodiments, a cavity 1002 overlying the RRAM device 108 may be defined by a lower surface that is arranged at a distance 1010 below an upper surface of the RRAM device 108.

In some embodiments, wherein sidewall spacers 318 are arranged along opposing sides of the RRAM device 108, the etchant 1008 may have an etching selectivity that etches the sidewall spacers 318 at a slower rate than the second ILD layer 104b. In such embodiments, the etchant 1008 may etch the sidewall spacers 308 less than the second ILD layer 104b, resulting in sidewall spacers 308 that extend to a position over a surface of the second ILD layer 104b arranged along a bottom cavity 1002.

Figure 11:
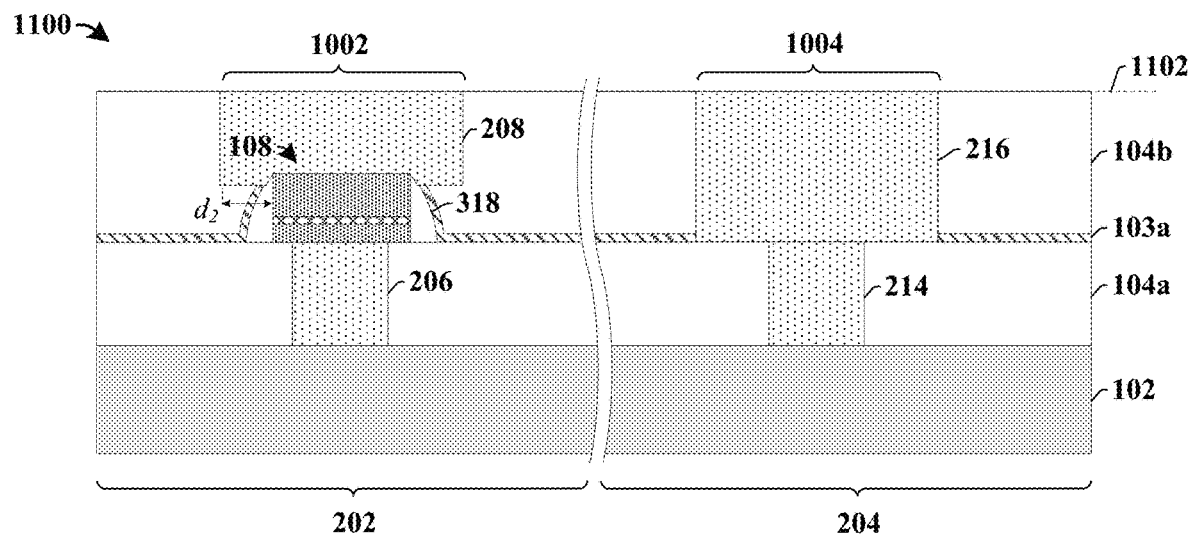

As illustrated in cross-sectional view 1100 of FIG. 11, a second conductive material is formed within the second plurality of cavities 1002-1004. In various embodiments, the second conductive material may comprise copper, tungsten, aluminum, and/or carbon nanotubes, for example. In various embodiments, the second conductive material may be deposited by way of a plating process (e.g., an electro plating process, an electro-less plating process) or by a vapor deposition technique (e.g., CVD, PVD, ALD, etc.). A planarization process (e.g., a chemical mechanical planarization process) may be performed (along line 1102) after the deposition of the second conductive material to form an upper interconnect wire 208 over the RRAM device 108 and a first interconnect wire 216 over the second lower interconnect structure 214. The upper interconnect wire 208 laterally extends past opposing sidewalls of the RRAM device 108 by a second distance $d_2$.

Figure 12:
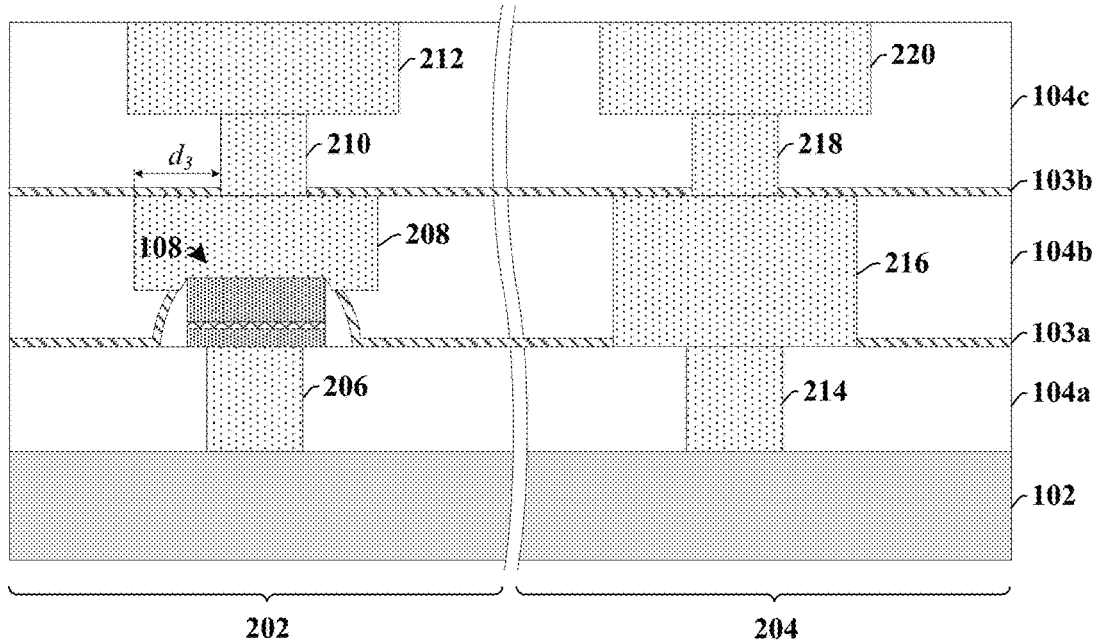

As illustrated in cross-sectional view 1200 of FIG. 12, a first interconnect via 210 and a second interconnect via 218 are formed within a third ILD layer 104c at locations respectively overlying the upper interconnect wire 208 and the first interconnect wire 216. The first interconnect via 210 is set back from one or more sidewalls of the upper interconnect wire 208 by a third distance $d_3$. An additional interconnect wire 212 may be formed within the third ILD layer 104c over the first interconnect vias 210 and a second interconnect wire 220 may be formed within the third ILD layer 104c over the first interconnect vias 210.

In some embodiments, the first interconnect via 210, the second interconnect via 218, the additional interconnect wire 212, and the second interconnect wire 220 may be formed using a dual damascene process, which selectively exposes third ILD layer 104c to an etchant (e.g., $CF_4$, $CHF_3$, $C_4F_8$, HF, etc.) configured to form a plurality of via holes and a plurality of metal trenches overlying the plurality of via holes. A third conductive material (e.g., copper, aluminum, carbon nanotubes, etc.) is subsequently formed in the plurality of via holes and metal trenches. In some embodiments, a second etch stop layer (ESL) 103b may be formed over the second ILD layer 104b prior to forming the third ILD layer 104c.

Figure 13:
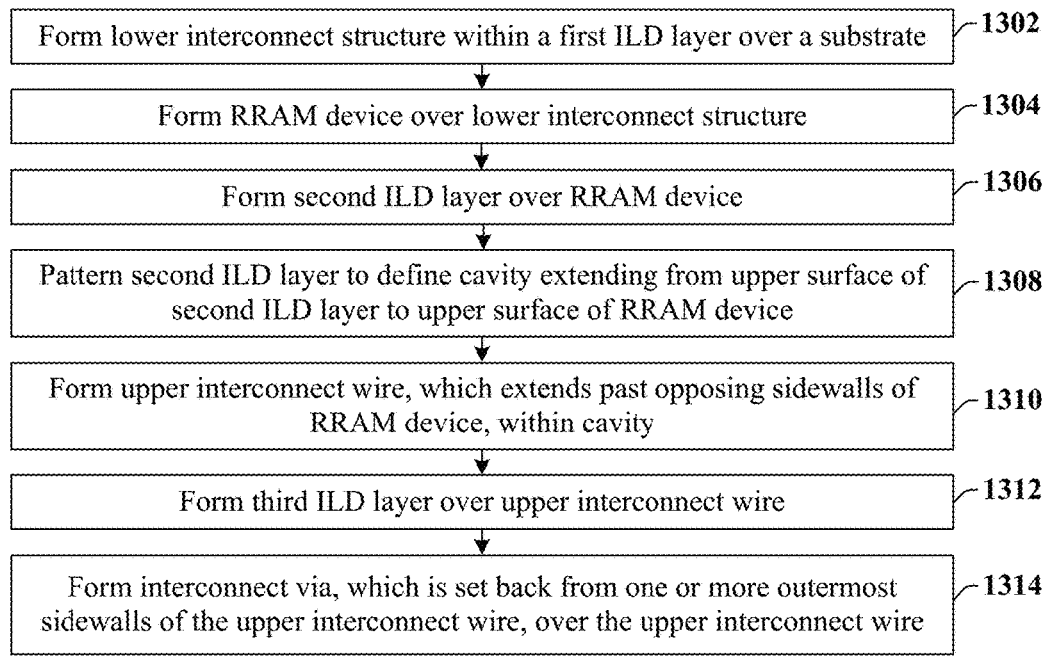
FIG. 13 illustrates a flow diagram of some embodiments of a method of forming an IC comprising an RRAM device having an upper electrode contacting an overlying interconnect wire.

FIG. 13 illustrates a flow diagram of some embodiments of a method 1300 of forming an IC comprising an RRAM device having an upper electrode contacting an interconnect wire.

While disclosed methods (e.g., methods 1300 and 2200) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1302, a lower interconnect structure is formed within a first inter-level dielectric (ILD) layer over a substrate. In various embodiments, the lower interconnect structure may comprise an interconnect contact, an interconnect via, or an interconnect wire. FIG. 6 illustrates some embodiments of a cross-sectional view 600 corresponding to act 1302.

Figure 8:
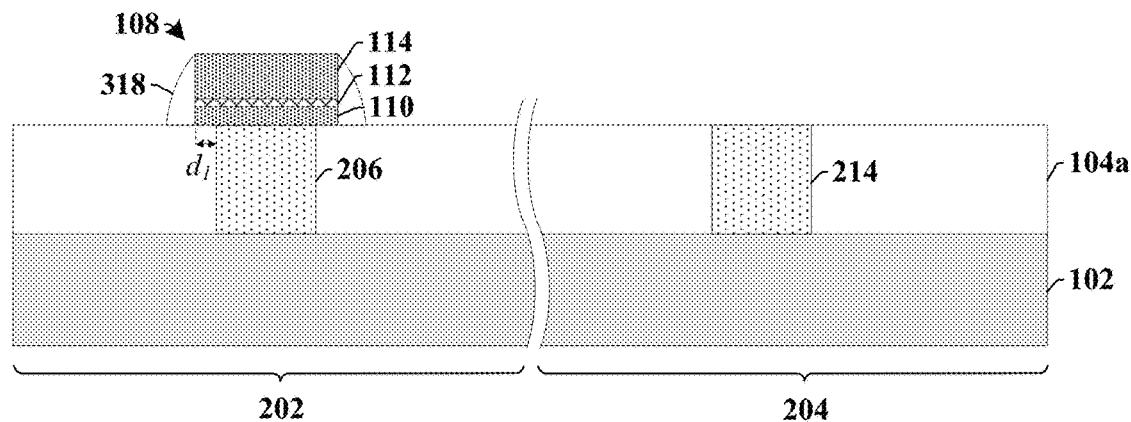

At 1304, an RRAM device is formed over the lower interconnect structure. FIGS. 7-8 illustrates some embodiments of cross-sectional views 700-800 corresponding to act 1304.

At 1306, a second ILD layer is formed over the RRAM device. FIG. 9 illustrates some embodiments of a cross-sectional view 900 corresponding to act 1306.

At 1308, the second ILD layer is patterned to define a cavity extending from an upper surface of the second ILD layer to an upper surface of the RRAM device. FIG. 10 illustrates some embodiments of a cross-sectional view 1000 corresponding to act 1308.

At 1310, an upper interconnect wire is formed within the cavity. The upper interconnect wire extends past opposing sidewalls of the RRAM device. FIG. 11 illustrates some embodiments of a cross-sectional view 1100 corresponding to act 1310.

At 1312, a third ILD layer is formed over the upper interconnect wire. FIG. 12 illustrates some embodiments of a cross-sectional view 1200 corresponding to act 1312.

At 1314, an interconnect via, which is set back from one or more outermost sidewalls of the upper interconnect wire, if formed over the upper interconnect wire. FIG. 12 illustrates some embodiments of a cross-sectional view 1200 corresponding to act 1314.

FIGS. 14-21 illustrate some embodiments of cross-sectional views 1400-2100 showing an alternative method of forming an IC comprising an RRAM device having an upper electrode contacting an interconnect wire. Although the cross-sectional-views shown in FIGS. 14-21 are described with reference to a method of forming an RRAM device having an upper electrode contacting an interconnect wire, it will be appreciated that the structures shown in the figures are not limited to the method of formation but rather may stand alone separate of the method.

Figure 14:
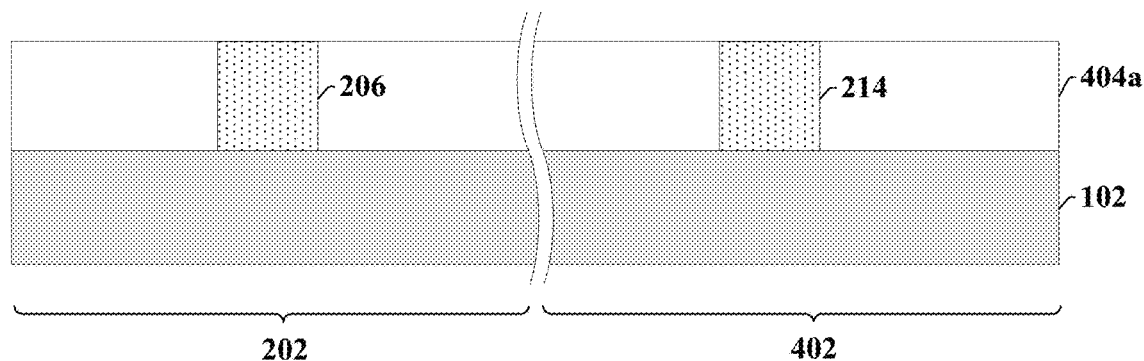
FIGS. 14-21 illustrate cross-sectional views showing some alternative embodiments of a method of forming an IC comprising an RRAM device having an upper electrode contacting an overlying interconnect wire.

As illustrated in cross-sectional view 1400 of FIG. 14, a lower interconnect layer is formed within a first ILD layer 404a over a substrate 102. The lower interconnect layer comprises a first lower interconnect structure 206 arranged within a memory region 202 and a second lower interconnect structure 214 arranged within a logic region 402.

Figure 15:
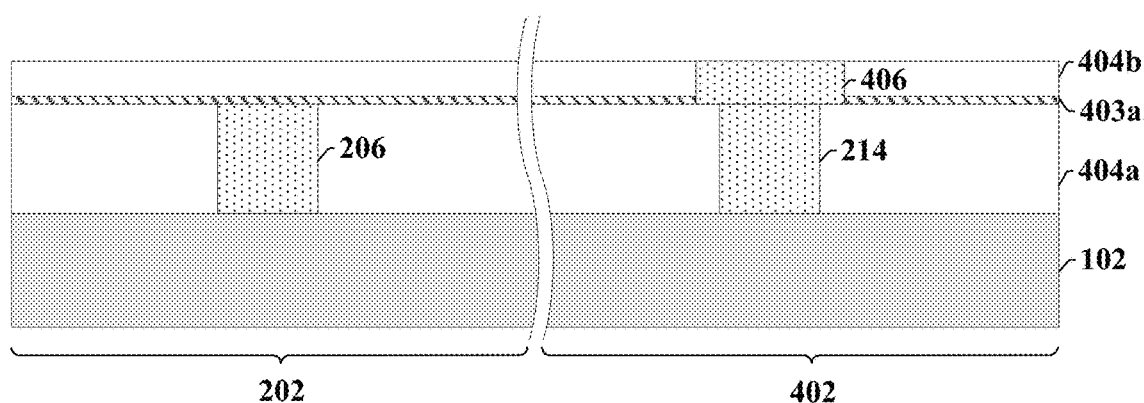

As illustrated in cross-sectional view 1500 of FIG. 15, a second ILD layer 404b is formed over the first ILD layer 404a within the memory region 202 and within the logic region 402. A first interconnect wire 406 is subsequently formed within the second ILD layer 404b within the logic region 402. The first interconnect wire 406 overlies the second lower interconnect structure 214. In some embodiments, a first etch stop layer (ESL) 403a may be formed over the first ILD layer 404a prior to forming the second ILD layer 404b. In some embodiments, the first interconnect wire 406 is formed using a single damascene process.

Figure 16:
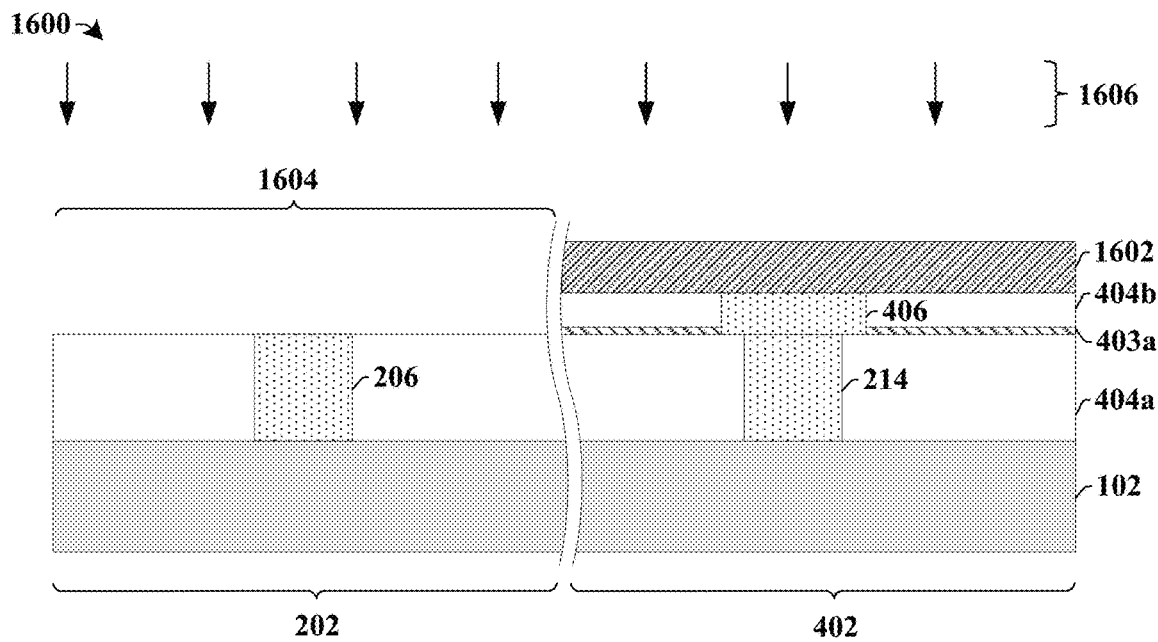

As illustrated in cross-sectional view 1600 of FIG. 16, the second ILD layer 404b is removed from within the memory region 202. In some embodiments, the second ILD layer 404b may be removed by selectively exposing the second ILD layer 404b to an etchant 1606 in areas 1604 not covered by a masking layer 1602. In various embodiments, the etchant 1606 may comprise a dry etchant (e.g., $CF_4$, $CHF_3$, $C_4F_8$, etc.) or a wet etchant (hydroflouric acid).

Figure 17A:
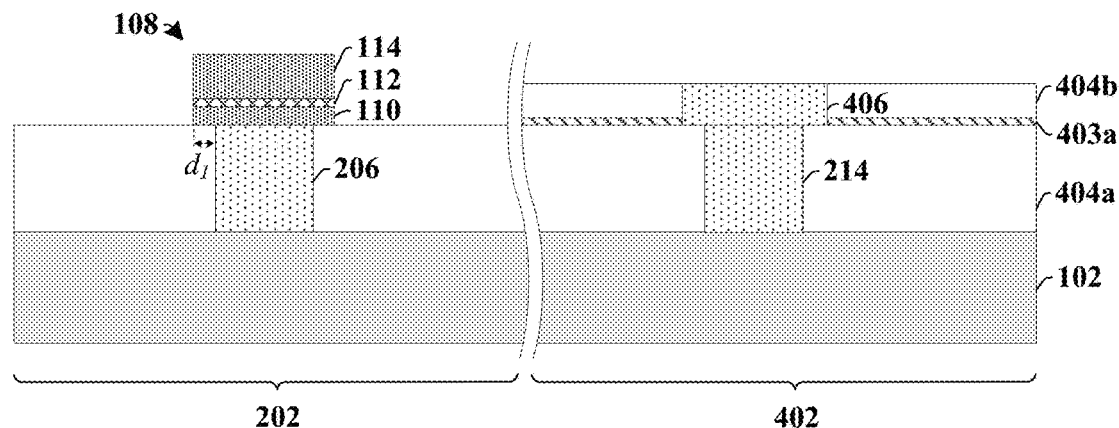
Figure 17B:
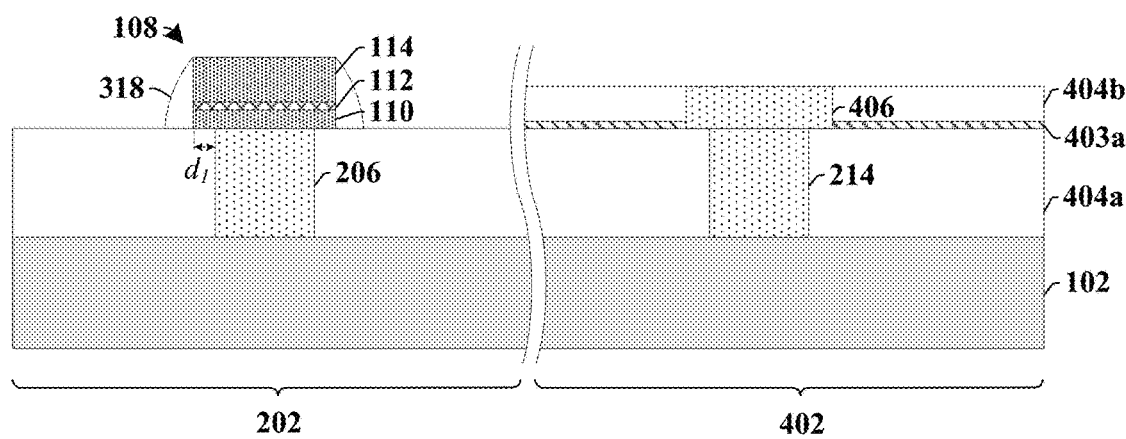

As illustrated in cross-sectional view 1700 of FIG. 17A, an RRAM device 108 is formed within the memory region 202 over the first lower interconnect structure 206. The RRAM device 108 comprises a dielectric data storage layer 112 arranged between a lower electrode 110 and an upper electrode 114. In some embodiments, as shown in cross-sectional view 1702 of FIG. 17B, sidewall spacers 318 may be formed along opposing sidewalls of the RRAM device 108. In such embodiments, the sidewall spacers 318 may be formed by depositing a spacer layer over the first ILD layer 404a. The spacer layer is subsequently etched to remove the spacer layer from horizontal surfaces, leaving the spacer layer along opposing sides of the RRAM device 108 as the sidewall spacers 318.

Figure 18:
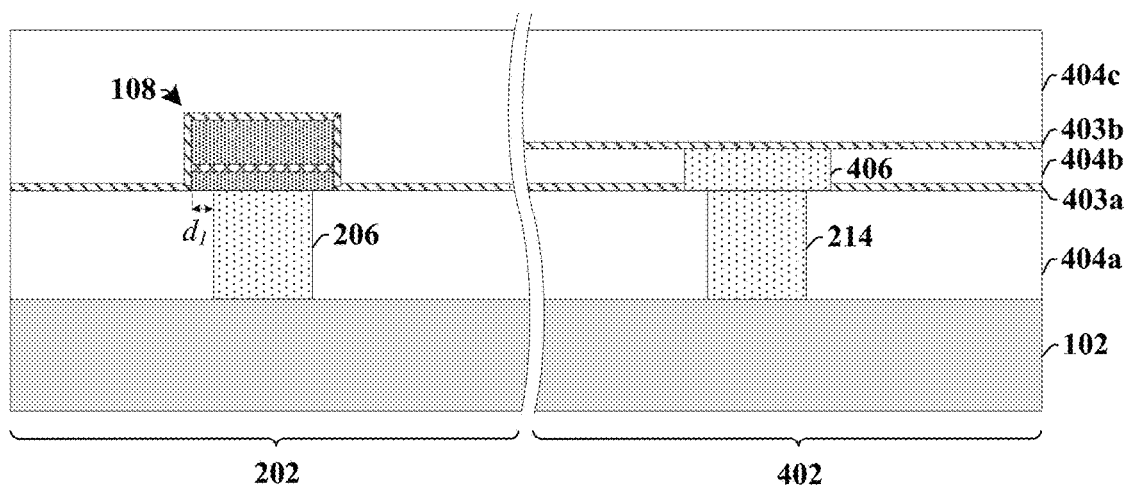

As illustrated in cross-sectional view 1800 of FIG. 18, a third ILD layer 404c is formed. The third ILD layer 404c is formed over the first ILD layer 404a and the RRAM device 108 within the memory region 202. The third ILD layer 404c is formed over the second ILD layer 404b within the logic region 402. In some embodiments, a second etch stop layer (ESL) 403b may be formed within the memory region 202 and the logic region 402 prior to forming the third ILD layer 404c.

Figure 19:
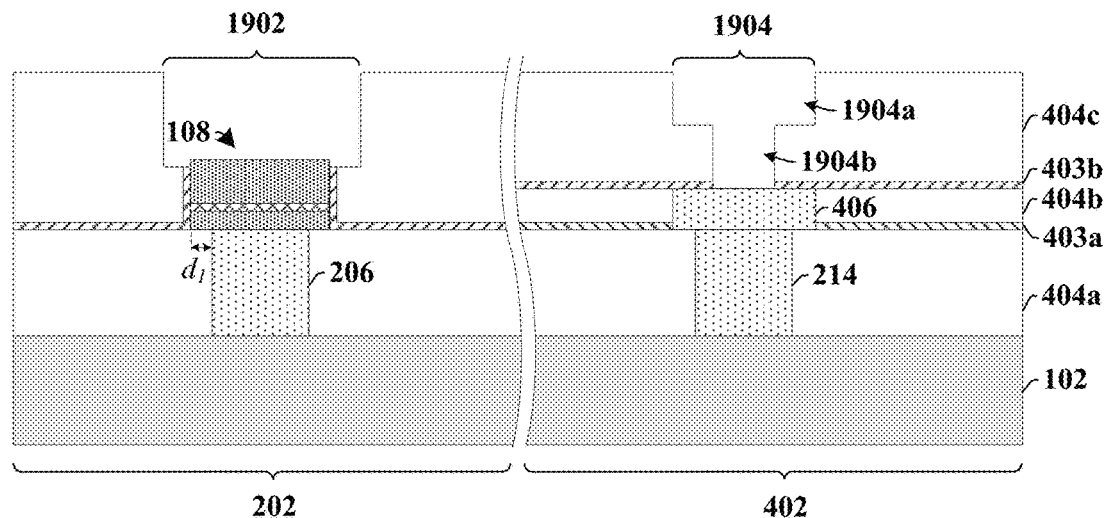

As illustrated in cross-sectional view 1900 of FIG. 19, the third ILD layer 404c is patterned to form a plurality of cavities 1902-1904. The plurality of cavities 1902-1904 comprise a first cavity 1902 vertically extending from an upper surface of the third ILD layer 404c to an upper surface of the RRAM device 108. The plurality of cavities 1902-

1904 further comprise a second cavity 1904 having an upper region 1904a arranged along the upper surface of the third ILD layer 404c and defining a interconnect wire trench, and a lower region 1904b defining a via hole arranged over the first interconnect wire 406.

Figure 20:
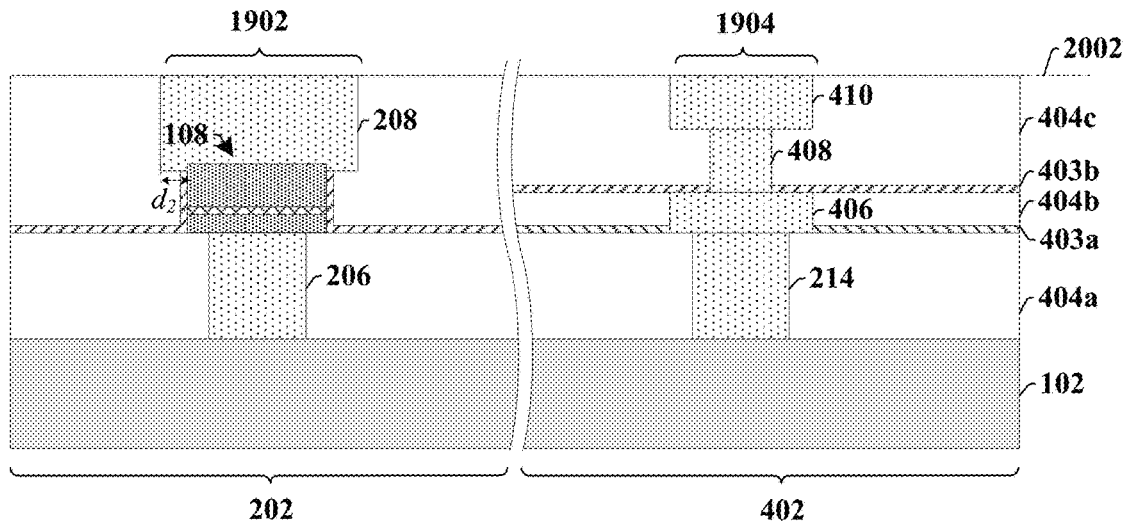

As illustrated in cross-sectional view 2000 of FIG. 20, a second conductive material is formed within the plurality of cavities 1902-1904. A planarization process (e.g., a chemical mechanical planarization process) may be performed (along line 2002) after formation of the second conductive material to form an upper interconnect wire 208 over the RRAM device 108 and a first interconnect via 408 and a second interconnect wire 410 over the first interconnect wire 406. The upper interconnect wire 208 laterally extends past opposing sidewalls of the RRAM device 108 by a second distance $d_2$.

Figure 21:
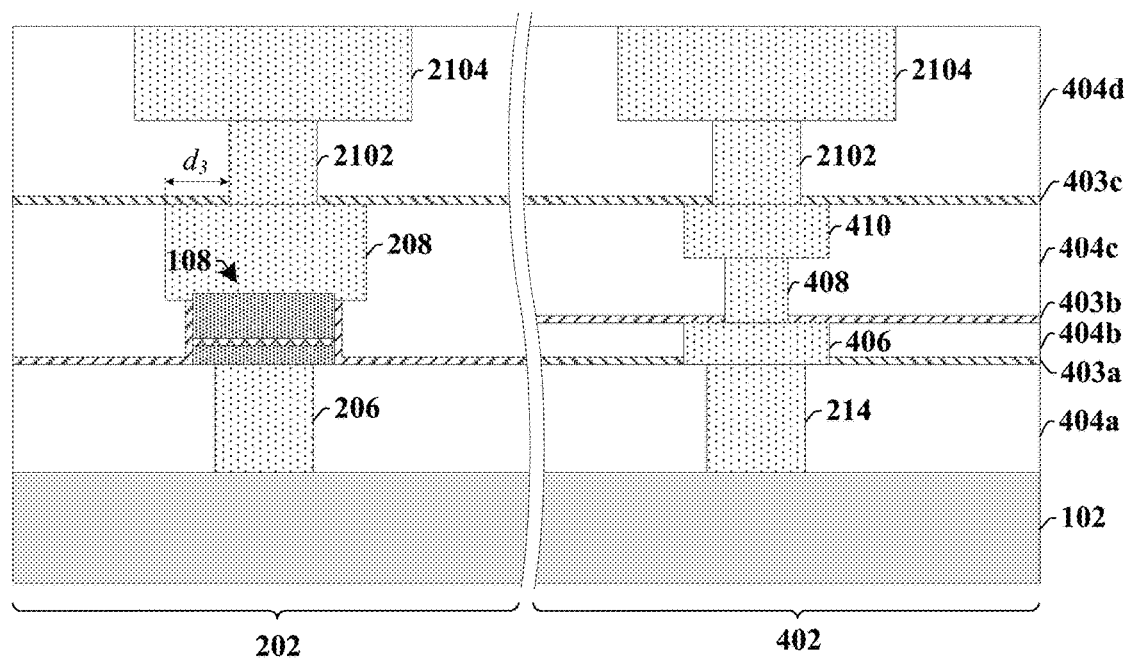

As illustrated in cross-sectional view 2100 of FIG. 21, a fourth ILD layer 404d is formed over the third ILD layer 404c within the memory region 202 and within the logic region 402. Additional interconnect vias 2102 and interconnect wires 2104 are formed within the fourth ILD layer 404d. In some embodiments, a third etch stop layer (ESL) 403c may be formed within the memory region 202 and the logic region 402 prior to forming the additional interconnect vias 2102 and interconnect wires 2104. In some embodiments, the additional interconnect vias 2102 and interconnect wires 2104 may be formed using a dual damascene process.

Figure 22:
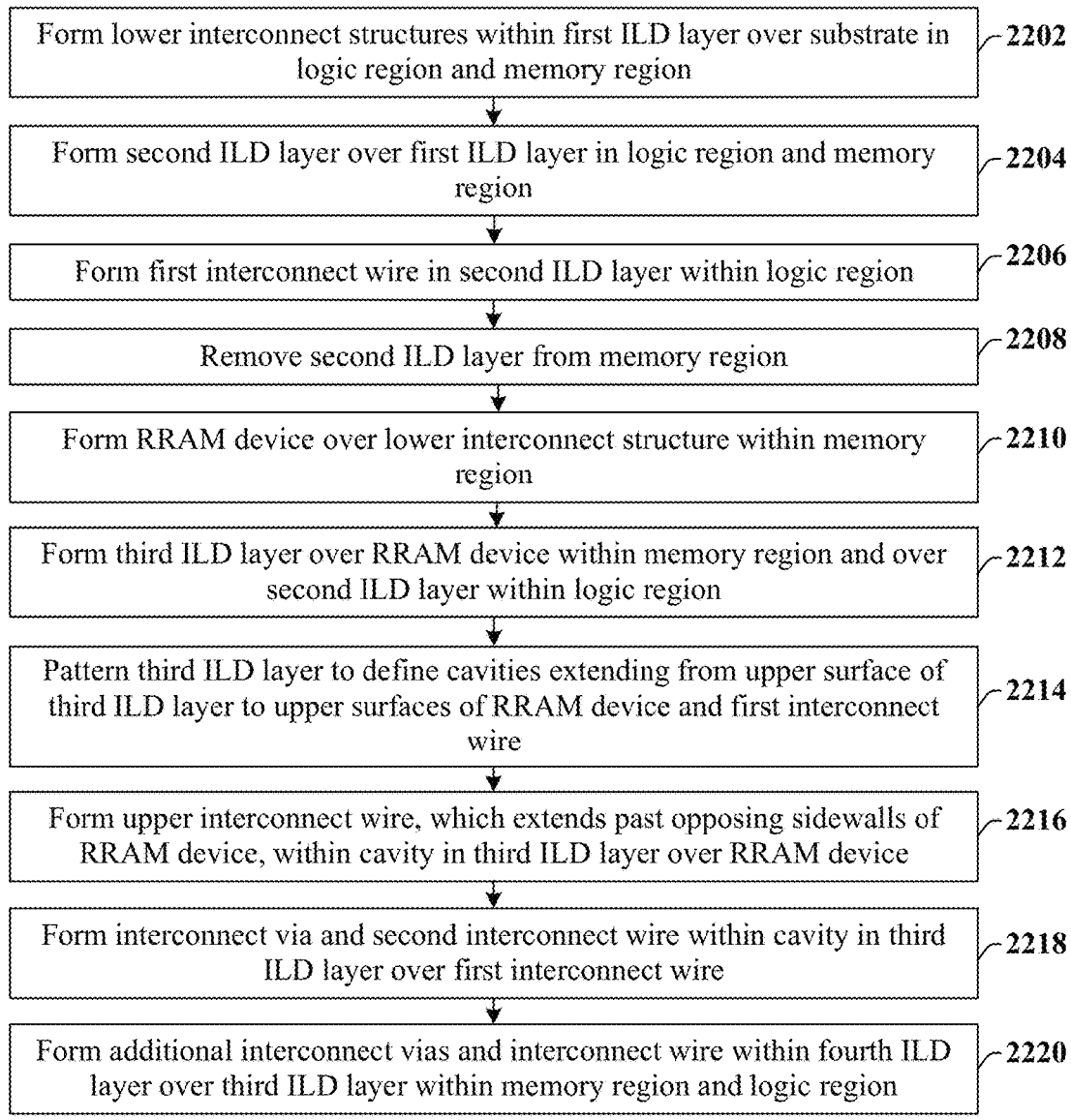
FIG. 22 illustrates a flow diagram of some alternative embodiments of a method of forming an IC comprising an RRAM device having an upper electrode contacting an overlying interconnect wire.

FIG. 22 illustrates a flow diagram of some alternative embodiments of a method 2200 of forming an IC comprising an RRAM device having an upper electrode contacting an interconnect wire.

At 2202, lower interconnect structures are formed within a first inter-level dielectric (ILD) layer over a substrate in a memory region and a logic region. In some embodiments, the lower interconnect structures may comprise a first lower interconnect structure formed within the memory region and a second lower interconnect structure formed within the logic region. FIG. 14 illustrates some embodiments of a cross-sectional view 1400 corresponding to act 2202.

At 2204, a second ILD layer is formed over the first ILD layer in the memory region and the logic region. FIG. 15 illustrates some embodiments of a cross-sectional view 1500 corresponding to act 2204.

At 2206, a first interconnect wire is formed in the second ILD layer within the logic region. The first interconnect wire may be formed over the second lower interconnect structure. FIG. 15 illustrates some embodiments of a cross-sectional view 1500 corresponding to act 2206.

At 2208, the second ILD layer is removed from within the memory region. FIG. 16 illustrates some embodiments of a cross-sectional view 1600 corresponding to act 2208.

At 2210, an RRAM device is formed over the first lower interconnect structure within the memory region. FIG. 17 illustrates some embodiments of a cross-sectional view 1700 corresponding to act 2210.

At 2212, a third ILD layer is formed over the RRAM device within the memory region and over the second ILD layer within the logic region. FIG. 18 illustrates some embodiments of a cross-sectional view 1800 corresponding to act 2212.

At 2214, the third ILD layer is patterned to define cavities within the third ILD layer. The cavities comprise a first cavity extending from an upper surface of the third ILD layer to an upper surface of the RRAM device and a second cavity extending from an upper surface of the third ILD layer to an upper surface of the first interconnect wire. FIG. 19 illustrates some embodiments of a cross-sectional view 1900 corresponding to act 2214.

At 2216, an upper interconnect wire, which extends past opposing sidewalls of the RRAM device is formed within the first cavity within the third ILD layer over the RRAM device. FIG. 20 illustrates some embodiments of a cross-sectional view 2000 corresponding to act 2216.

At 2218, an interconnect via and a second interconnect wire are formed within the second cavity in the third ILD layer over the first interconnect wire. FIG. 20 illustrates some embodiments of a cross-sectional view 2000 corresponding to act 2218.

At 2220, additional interconnect vias and interconnect wires are formed within a fourth ILD layer over the third ILD layer within the memory region and within the logic region. FIG. 21 illustrates some embodiments of a cross-sectional view 2100 corresponding to act 2218.

Therefore, in some embodiments, the present disclosure relates to an integrated circuit having an interconnect wire contacting an upper electrode of the RRAM (resistive random access memory) device to provide for a good electrical connection to the upper electrode, which increases a process window of the RRAM device and provides for a low upper electrode resistance.

In some embodiments, the present disclosure relates to an integrated chip. The integrated chip comprises a resistive random access memory (RRAM) device arranged over a substrate and comprising a dielectric data storage layer disposed between a lower electrode and an upper electrode. An upper interconnect wire contacts an upper surface of the upper electrode, and an interconnect via is arranged onto the upper interconnect wire. The interconnect via is set back from one or more outermost sidewalls of the upper interconnect wire.

In other embodiments, the present disclosure relates to an integrated chip. The integrated chip comprises a lower interconnect structure surrounded by a first inter-level dielectric (ILD) layer arranged over a substrate. A resistive random access memory (RRAM) device is arranged over the lower interconnect structure and is surrounded by a second ILD layer. The RRAM device comprises a dielectric data storage layer disposed between a lower electrode and an upper electrode. An upper interconnect wire contacts an upper surface of the upper electrode. The upper interconnect wire extends past opposing outermost sidewalls of the RRAM device.

In yet other embodiments, the present disclosure relates a method of forming an integrated chip. The method comprises forming a lower interconnect structure within a first inter-level dielectric (ILD) layer over a substrate. The method further comprises forming an RRAM device over the lower interconnect structure, and forming a second ILD layer over the RRAM device. The method further comprises patterning the second ILD layer to define a cavity extending from an upper surface of the second ILD layer to an upper surface of RRAM device. The method further comprises forming an upper interconnect wire, which extends past opposing sidewalls of the RRAM device, within the cavity in the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a memory device over a substrate;
   forming a sidewall spacer along opposing sides of the memory device;
   forming an inter-level dielectric (ILD) layer over the memory device;
   performing an etching process to selectively etch the ILD layer to define a first cavity that exposes an entire top of the memory device;
   forming a conductive material within the first cavity; and
   wherein a part of the sidewall spacer is arranged directly between the first cavity and a side of the memory device after selectively etching the ILD layer.

2. The method of claim 1, further comprising:
   forming an etch stop layer over the memory device and along opposing sides of the memory device.

3. The method of claim 2, further comprising:
   selectively etching the etch stop layer to define the first cavity.

4. The method of claim 3, wherein the first cavity is defined by a sidewall of the ILD layer and an upper surface of the etch stop layer.

5. The method of claim 2, wherein the memory device and the etch stop layer have bottom surfaces that are substantially co-planar.

6. The method of claim 1, wherein the etching process concurrently etches the ILD layer to define the first cavity and to define a second cavity that is laterally separated from the first cavity by the ILD layer, wherein the second cavity is defined by a smooth sidewall of the ILD layer that extends between upper and lower surfaces of the ILD layer.

7. The method of claim 2, wherein the etching process etches the sidewall spacer to have a different height than the etch stop layer.

8. The method of claim 1, further comprising:
   forming an upper ILD layer over the ILD layer;
   etching the upper ILD layer to define a via hole directly over the conductive material within the first cavity, wherein the via hole is laterally set back from one or more outermost sidewalls of the conductive material within the first cavity; and
   forming an additional conductive material within the via hole.

9. A method of forming an integrated chip, comprising:
   forming a memory device over a lower interconnect structure within a first inter-level dielectric (ILD) layer over a substrate;
   forming an etch stop layer over and along opposing sides of the memory device;
   forming a second ILD layer over the etch stop layer;
   performing an etching process to selectively etch the second ILD layer and the etch stop layer to define a trench that exposes a top of the memory device;
   forming a conductive material within the trench to form an upper interconnect wire on the memory device; and
   wherein the etch stop layer extends above the memory device before the etching process and is reduced to below the top of the memory device after the etching process.

10. The method of claim 9, further comprising:
    selectively etching the second ILD layer to further define a second trench, wherein both the trench and the second trench are defined by one or more surfaces of the etch stop layer.

11. The method of claim 9, wherein the etching process concurrently etches the second ILD layer to define the trench and to define a second trench that is laterally separated from the trench by the second ILD layer, wherein the second trench is defined by a smooth sidewall of the second ILD layer that continuously extends between upper and lower surfaces of the second ILD layer.

12. A method of forming an integrated chip, comprising:
    forming a first interconnect and a second interconnect within a first inter-level dielectric (ILD) layer over a substrate;
    forming a memory device over the first interconnect;
    forming one or more sidewall spacers along opposing sides of the memory device;
    forming an etch stop layer on the first ILD layer and over and along opposing sides of the memory device;
    forming a second ILD layer on the etch stop layer and the memory device;
    performing an etching process on the second ILD layer and the etch stop layer, wherein the etching process concurrently defines a first opening exposing an upper surface of the memory device and a second opening exposing an upper surface of the second interconnect;
    wherein the etching process etches the one or more sidewall spacers; and
    forming a conductive material within the first opening and the second opening.

13. The method of claim 12, wherein the etch stop layer is formed to continuously extend from directly over the memory device to contact a top surface of the second interconnect.

14. The method of claim 12,
    wherein the conductive material within the first opening has a lower surface continuously extending from directly over the one or more sidewall spacers to laterally past an outermost sidewall of the one or more sidewall spacers; and
    wherein a portion of the lower surface is below a top surface of the memory device.

15. The method of claim 12, wherein the etching process removes parts of the etch stop layer disposed on upper portions of the one or more sidewall spacers.

16. The method of claim 12, wherein the second opening is defined by a sidewall of the second ILD layer that continuously extends between uppermost and bottommost surfaces of the second ILD layer.

17. The method of claim 12, wherein the etch stop layer is deposited to continuously extend from below a bottom surface of the second ILD layer to over the memory device.

18. The method of claim 12, further comprising:
    performing a planarization process to remove the conductive material from over the second ILD layer and to define a first interconnect wire within the first opening and a second interconnect wire within the second opening, the second interconnect wire having a greater height than the first interconnect wire.

19. The method of claim 18, further comprising:
    forming a first via to contact an upper surface of the first interconnect wire, wherein the first interconnect wire continuously extends past an outermost sidewall of the first via; and forming a second via to contact the upper surface of the second interconnect wire, wherein the second interconnect wire continuously extends past an outermost sidewall of the second via.

20. The method of claim 12, wherein the etch stop layer extends above the memory device before the etching process and is reduced to below a top of the memory device after the etching process.

* * * * *